United States Patent
Armgarth et al.

(10) Patent No.: US 6,806,511 B2
(45) Date of Patent: Oct. 19, 2004

(54) ELECTROCHEMICAL DEVICE

(75) Inventors: Mårten Armgarth, Linköping (SE); Miaoxiang Chen, Kista (SE); David A. Nilsson, Norrköping (SE); Rolf M. Berggren, Vreta Kloster (SE); Thomas Kugler, Linghem (SE); Tommi Remonen, Nyköping (SE)

(73) Assignee: Acreo AB, Kista (SE)

( * ) Notice: Subject to any disclaimer, the term of this patent is extended or adjusted under 35 U.S.C. 154(b) by 0 days.

(21) Appl. No.: 10/091,419

(22) Filed: Mar. 7, 2002

(65) Prior Publication Data

US 2002/0158295 A1 Oct. 31, 2002

Related U.S. Application Data

(60) Provisional application No. 60/276,218, filed on Mar. 16, 2001.

(30) Foreign Application Priority Data

Mar. 7, 2001 (SE) .............................................. 0100748

(51) Int. Cl.$^7$ .......................................... H01L 31/0328
(52) U.S. Cl. ...................... 257/197; 205/122; 205/123; 205/317
(58) Field of Search .............................. 257/40; 438/99; 361/500, 504; 429/124

(56) References Cited

U.S. PATENT DOCUMENTS

| | | | |
|---|---|---|---|
| 4,764,415 A | | 8/1988 | Isoda et al. |
| 5,300,575 A | * | 4/1994 | Jonas et al. ................. 525/186 |
| 5,347,144 A | * | 9/1994 | Garnier et al. ................ 257/40 |
| 6,207,034 B1 | * | 3/2001 | Madden et al. ............. 205/122 |
| 6,444,400 B1 | * | 9/2002 | Cloots et al. ................ 430/311 |
| 2002/0053320 A1 | * | 5/2002 | Duthaler et al. ............ 118/249 |

FOREIGN PATENT DOCUMENTS

| | | |
|---|---|---|
| EP | 1 041 653 | 10/2000 |
| SE | 517 720 C2 | 2/1998 |
| WO | 99/10939 | 3/1999 |

OTHER PUBLICATIONS

Kvarnstrom et al., In situ spectroelectrochemical characterization of poly(3,4–ethylenedioxythiophene), 1999, Electrochimica Acta, 44, 2739–2750.*

(List continued on next page.)

*Primary Examiner*—Wael Fahmy
*Assistant Examiner*—Nathan W. Ha
(74) *Attorney, Agent, or Firm*—Burns, Doane, Swecker & Mathis, L.L.P.

(57) ABSTRACT

An electrochemical transistor device is provided, comprising a source contact, a drain contact, at least one gate electrode, an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and a solidified electrolyte in direct electrical contact with the electrochemically active element and said at least one gate electrode and interposed between them in such a way that electron flow between the electrochemically active element and said gate electrode(s) is prevented. In the device, flow of electrons between source contact and drain contact is controllable by means of a voltage applied to said gate electrode(s).

42 Claims, 12 Drawing Sheets

OTHER PUBLICATIONS

Chao et al., "Characterization of a "Solid–State" Polyaniline–Based Transistor: Water Vapor Dependent Characteristics of a Device Employing a Poly(vinyl alcohol)/Phosphoric Acid Solid–State Electrolyte", J. Am Chem. Soc., 1987, pp. 6627–6631, vol. 109, American Chemical Society, Washington, D.C., USA.

"Application of Dopant–Induced Structure–Property Changes of Conducting Polymers" by R.H. Baughman and L.W. Shacklette from Science and Applications of Conducting Polymers, Proceedings of the Sixth Europhysics Industrial Workshop held in Lofthus Norway, May 1990, pp. 47 to 61.

J. Solid State Electrochem, vol. 2, No. 2, 1998, V. Rani, K.S.V. Santhanam, "Polycarbazole–Based Electrochemical Transistor", p. 99 to p. 101, Abstract.

* cited by examiner

ELECTROCHEMICAL DEVICE

Priority is claimed under 35 U.S.C. §119(a) for the filing of Swedish Application No. 0100748-3 on Mar. 7, 2001, and under 35 U.S.C. §119(e) for the filing of U.S. Provisional Application No. 60/276,218 on Mar. 16, 2001.

FIELD OF THE INVENTION

The present invention relates to electrochemical devices, in particular to printable, electrochemical transistor devices based on conducting organic materials.

BACKGROUND OF THE INVENTION

Semiconducting and conducting organic materials, both polymers and molecules, have successfully been included in a large range of electronic devices, e g electrochemical devices, for instance as dynamic colorants in smart windows and in polymer batteries. Reversible doping and de-doping involving mobile ions switches the material between different redox states.

Use has been made of semiconducting polymers for the realisation of field effect transistor (FET) devices. The transistor channel of these devices comprises the semiconducting polymer in question, and their function is based on changes in charge carrier characteristics in the semiconducting polymer, caused by an externally applied electric field. In such transistors, the polymer is used as a traditional semiconductor, in that the electric field merely redistributes charges within the polymer material. One such transistor has been realised, which is adapted for miniaturisation and can be used for the production of integrated circuits consisting entirely of polymer material (PCT publication WO99/10939). A stack of sandwiched layers is described, with either a top-gate or a bottom-gate structure. A transistor device with a similar architecture, also using a polymer as semiconducting material in the channel of the transistor, is described in the European patent application EP1041653.

Another type of transistor device based on organic materials utilises electrochemical redox reactions in the organic material. These devices comprise an electrolyte and a conducting polymer that can be switched between an oxidised and a reduced state. One of these oxidation states then corresponds to low, preferably zero, conductivity in the material, whereas the other oxidation state corresponds to a high conductivity relative to the first state. Electrochemical transistor devices have been used as sensors, e g for detection of oxidant in a solution (see, for review, Baughman and Shacklette, Proceedings of the Sixth Europhysics Industrial Workshop (1990), p 47–61). Furthermore, a transistor of the electrochemical type is reported in Rani et al, J Solid State Electrochem (1998), vol 2, p 99–101. The gate electrode architecture in this prior art transistor is shown in FIG. 1 of this reference.

Problems with electrochemical transistor devices of the prior art include the fact that they are difficult and expensive to manufacture. In particular, no electrochemical transistor devices have been disclosed which are capable of being mass produced. Furthermore, the practical use of prior art electrochemical transistor devices has been hampered by their comparatively high power consumption. Furthermore, materials used in prior art devices suffer from a lack of environmental friendliness, processability and economic production possibilities, There is therefore a need for new and improved electrochemical chemical transistor devices.

SUMMARY OF THE INVENTION

One of the objects of the present invention is then to meet this demand, by developing the art of electrochemical transistor devices, and by providing a device with handling, production, disposal and other characteristics superior to those of the prior art.

Another object of the present invention is to provide vide an electrochemical transistor device which can be deposited on a large range of different rigid or flexible substrates by conventional printing methods.

Yet another object of the present invention is to provide an environmentally safe electrochemical transistor device, so that the disposal of the device, along with any support onto which it has been deposited, doesn't give rise to handling problems, and so that no safety restrictions have to be imposed on the use of the device.

Still another object of the present invention is to make possible new applications of conducting organic materials, using several different properties of such materials in combination.

A further object of the invention is to provide processes for the production of such devices, which processes utilise conventional printing methods or other deposition techniques that are well known, relatively un-expensive and easily scaled up.

The aforementioned objects are met by an electrochemical transistor device as defined in the independent claims. Specific embodiments of the invention are defined in the dependent claims. In addition, the present invention has other advantages and features apparent from the detailed description below.

Thus, a supported or self-supporting electrochemical transistor device is provided, which comprises:

a source contact, a drain contact, at least one gate electrode, an electrochemically active element arranged between, and in direct electrical contact with, the source and drain contacts, which electrochemically active element comprises a transistor channel and is of a material comprising an organic material having the ability of electrochemically altering its conductivity through change of redox state thereof, and a solidified electrolyte in direct electrical contact with the electrochemically active element and said at least one gate electrode and interposed between them in such a way that electron flow between the electrochemically active element and said gate electrode(s) is prevented, whereby flow of electrons between source contact and drain contact is controllable by means of a voltage applied to said gate electrode(s).

The architecture of the electrochemical transistor device according to the invention is advantageous in that it makes possible the realisation of a layered transistor device with only a few layers, having for example one patterned layer of material comprising a conducting organic material, which layer comprises source and drain contacts and gate electrode(s), as well as the electrochemically active element. The source and drain contacts and the electrochemically active element are then preferably formed by one continuous piece of said material. The source and drain contacts could alternatively be formed from another electrically conducting material in direct electrical contact with the electrochemically active element, The gate electrode(s) may also be of another electrically conducting material. To provide for the necessary electrochemical reactions, whereby the conductivity in the active element is changed, a solidified electrolyte is arranged so that it is in direct electrical contact with both the active element and the gate electrode(s).

In a preferred embodiment, the source and drain contacts and gate electrode(s), as well as the active element, are all arranged to lie in a common plane, further simplifying production of the device by ordinary printing methods, Thus, the electrochemical device according to this embodiment of the invention uses a lateral device architecture. A layer of solidified electrolyte can advantageously be deposited so that it covers, at least partly, the gate electrode(s) as well as covering the electrochemically active element. This layer of solidified electrolyte may be continuous or interrupted, depending partly on which of two main types of transistor architectures is to be realised (see below).

The electrochemical transistor device according to the invention allows for control of electron flow between source and drain contacts. The conductivity of the transistor channel of the electrochemically active element can be modified, through altering of the redox state of the organic material therein. This is achieved by application of a voltage to the gate electrode(s), which generates an electric field in the electrolyte. In the contact area between electrolyte and electrochemically active element, electrochemical redox reactions take place, which change the conductivity of the organic material. Either the organic material in the transistor channel is modified from a conducting state to a non-conducting state as a result of said redox reactions, or it is modified from a non-conducting to a conducting state.

As is readily appreciated by the skilled person, and in analogy to conventional field effect transistors, the electrochemical transistor device of the invention may readily be made to function as a diode device through short-circuiting of the gate electrode and source contact, or of the gate electrode and drain contact. One non-limiting example of this is described in the description below. However, any configuration of the electrochemical transistor device may naturally be used as a diode in this fashion.

Depending on the precise patterning of the conducting organic material and the electrolyte, the electrochemical transistor device of the invention can either be of a bi-stable or a dynamic type. In the bi-stable transistor embodiment, a voltage applied to the gate electrode(s) leads to a change in conductivity in the transistor channel that is maintained when the external circuit is broken, i e when the applied voltage is removed, The electrochemical reactions induced by the applied voltage can not be reversed, since the electrochemically active element and the gate electrode(s) are not in direct electrical contact with each other, but separated by electrolyte. In this embodiment, the transistor channel can be switched between non-conducting and conducting states using only small, transient gate voltages. The bi-stable transistor can be kept in an induced redox state for days, and, in the most preferred, ideal case, indefinitely.

Thus, the bi-stable transistor embodiment of the present invention offers a memory function, in that it is possible to switch it on or off using only a short voltage pulse applied to the gate electrode. The transistor stays in the conducting or non-conducting redox state even after the applied voltage has been removed. A further advantage with such bi-stable transistors is that close to zero-power operation is made possible, since the short voltage pulses applied to the gate need not be larger than a fraction of the gate voltages needed for operation of a corresponding dynamic device.

In the dynamic transistor embodiment, the change in the redox state of the material is reversed spontaneously upon withdrawal of the gate voltage. This reversal is obtained through the provision of a redox sink volume adjacent to the transistor channel in the electrochemically active element. Also, a second gate electrode is provided, and arranged so that the two gate electrodes are positioned on either side of the electrochemically active element, one closer to the transistor channel, and the other closer to the redox sink volume. Both gate electrodes are separated from the electrochemically active element by electrolyte. Application of a voltage between the two gate electrodes results in the electrochemically active element being polarised, whereby redox reactions take place in which the organic material in the transistor channel is reduced while the organic material in the redox sink volume is oxidised, or vice versa. Since the transistor channel and the redox sink volume are in direct electrical contact with each other, withdrawal of gate voltage leads to a spontaneous reversal of the redox reactions, so that the initial conductivity of the transistor channel is re-established. It is to be stressed that in contrast to electrochemical transistors of the prior art, dynamic transistors according to this embodiment of the present invention revert spontaneously to the initial conductivity state without the need for a reversing bias.

The electrochemical transistor device according to the invention is also particularly advantageous in that it can be easily realised on a support, such as polymer film or paper. Thus, the different components can be deposited on the support by means of conventional printing techniques such as screen printing, offset printing, ink-jet printing and flexographic printing, or coating techniques such as knife coating, doctor blade coating, extrusion coating and curtain coating, such as described in "Modern Coating and Drying Technology" (1992), eds E D Cohen and E B Gutoff, VCH Publishers Inc, New York, N.Y., USA. In those embodiments of the invention that utilise a conducting polymer as the organic material (see below for materials specifications), this material can also be deposited through in situ polymerisation by methods such as electropolymerisation, UV-polymerisation, thermal polymerisation and chemical polymerisation. As an alternative to these additive techniques for patterning of the components, it is also possible to use subtractive techniques, such as local destruction of material through chemical or gas etching, by mechanical means such as scratching, scoring, scraping or milling, or by any other subtractive methods known in the art. An aspect of the invention provides such processes for the manufacture of an electrochemical transistor device from the materials specified herein.

However, the invention is not limited to supported devices, as the contacts and electrode(s), electrochemically active element and electrolyte can be arranged in such a way that they support each other. An embodiment of the invention thus provides for a self-supporting device.

According to a preferred embodiment of the invention, the electrochemical transistor device is encapsulated, in part or entirely, for protection of the device. The encapsulation retains any solvent needed for e g the solidified electrolyte to function, and also keeps oxygen from disturbing the electrochemical reactions in the device. Encapsulation can be achieved through liquid phase processes. Thus, a liquid phase polymer or organic monomer can be deposited on the device using methods such as spray-coating, dip-coating or any of the conventional printing techniques listed above. After deposition, the encapsulant can be hardened for example by ultraviolet or infrared irradiation, by solvent evaporation, by cooling or through the use of a two-component system, such as an epoxy glue, where the components are mixed together directly prior to deposition. Alternatively, the encapsulation is achieved through lamination of a solid film onto the electrochemical transistor device. In preferred embodiments of the invention, in which the components of the electrochemical transistor device are arranged on a support, this support can function as the bottom encapsulant. In this case encapsulation is made more convenient in that only the top of the sheet needs to be covered with liquid phase encapsulant or laminated with solid film.

The invention will now be further described with reference to specific embodiments thereof and to specific materials. This detailed description is intended for purposes of exemplification, not for limitation in any way of the scope of the invention as claimed.

DETAILED DESCRIPTION OF PREFERRED EMBODIMENTS

Definitions

Figure 1A:
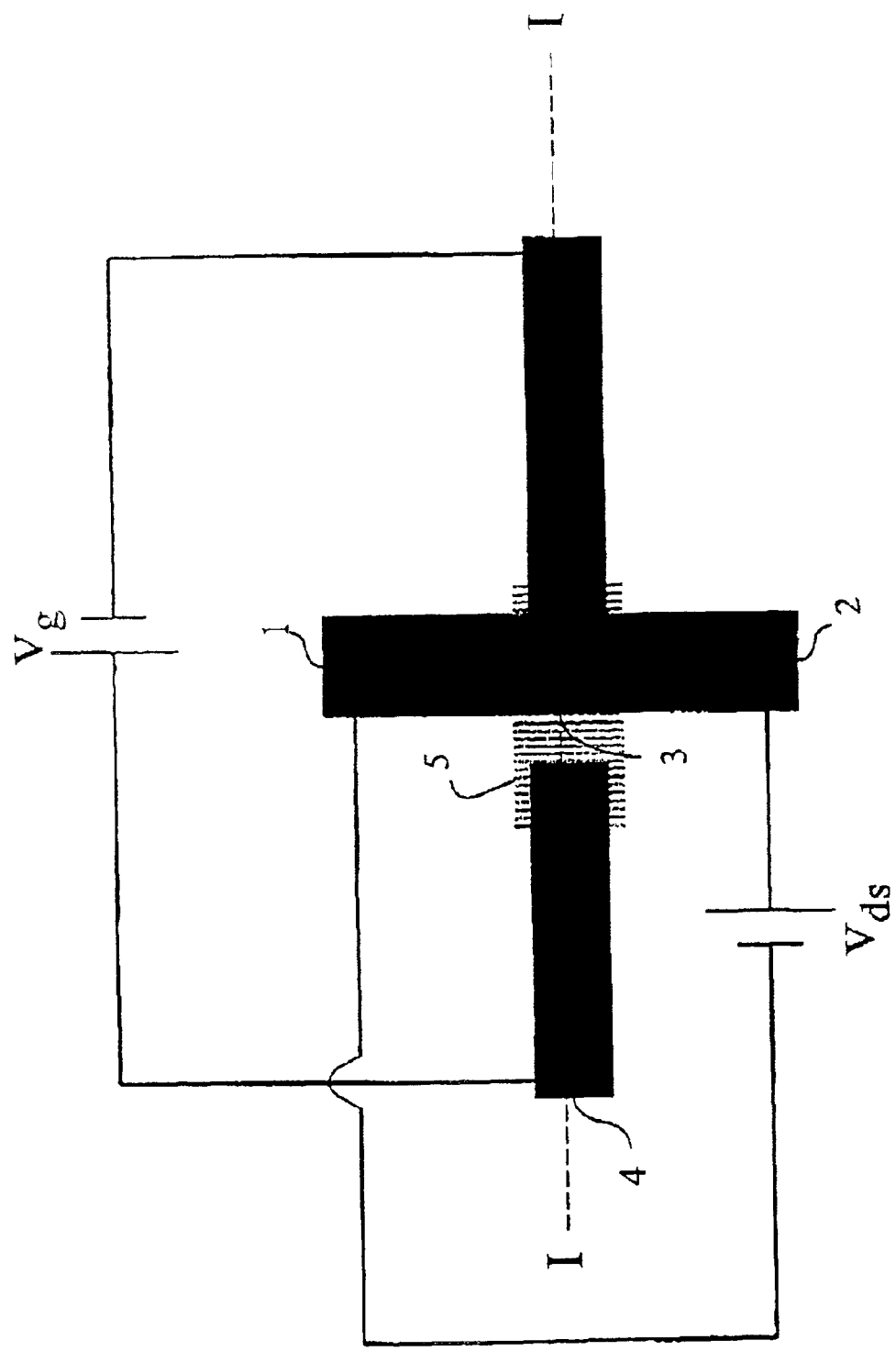
FIG. 1. Schematic structure of one embodiment of a bi-stable transistor according to the invention, showing (A) a top view, (B) a cross-section:along I—I in A, and (C) a top view with a different position for application of $V_g$.

Bi-stable electrochemical transistor: an electrochemical transistor device in which the transistor channel retains its redox state (and hence its conductivity characteristics) when the gate voltage is removed.

Dynamic electrochemical transistor: an electrochemical transistor device in which the transistor channel spontaneously returns to its initial redox state (and hence to its initial conductivity characteristics) when the gate voltage is removed.

Source contact: an electrical contact which provides charge carriers to a transistor channel.

Drain contact; an electrical contact which accepts charge carriers from a transistor channel.

Gate electrode: an electrical contact of which any fraction of the surface area is in direct electrical contact with solidified electrolyte, and therefore in ionic contact with the electrochemically active element.

Electrochemically active element: an "electrochemically active element" according to the present invention, is a piece of a material comprising an organic material having a conductivity that can be electrochemically altered through changing of the redox state of said organic material. The electrochemically active element is in ionic contact with at least one gate electrode via a solidified electrolyte. The electrochemically active element may furthermore be integrated with each of the source and drain contacts individually or with both of them, being composed of the same or different materials. The electrochemically active element in the electrochemical transistor devices of the invention comprises a transistor or channel, and may furthermore comprise a redox sink volume.

Transistor channel: the "transistor channel" of the electrochemically active element establishes electrical contact between source and drain contacts.

Redox sink volume: in certain embodiments of the invention, the electrochemically active element further comprises a "redox sink volume". This is a part of the electrochemically active element adjacent to and in direct electrical contact with the transistor channel, which can provide or accept electrons to or from the transistor channel. Thus, any redox reactions within the transistor channel are complemented by opposing reactions within the redox sink volume.

Redox state when reference is made to changes in the "redox state" of the electrochemically active element, this is intended to include cases where the organic material in the electrochemically active element is either oxidised or reduced, as well as cases where there is a redistribution of charges within the electrochemically active element, so that one end. (e g the transistor channel) is reduced and the other end (e g the redox sink volume) is oxidised. In the latter case, the electrochemically active element as a whole, retains its overall redox state, but its redox state has nevertheless been changed according to the definition used herein, due to the internal redistribution of charge carriers.

Direct electrical contact: Direct physical contact (common interface) between two phases (for example electrode and electrolyte) that allows for the exchange of charges through the interface. Charge exchange through the interface can comprise transfer of electrons between electrically conducting phases, transfer of ions between ionically conducting phases, or conversion between electronic current and ionic current by means of electrochemistry at an interface between for example electrode and electrolyte or electrolyte and electrochemically active element, or by occurrence of capacitive currents due to the charging of the Helmholtz layer at such an interface.

Solidified electrolyte: for the purposes of the invention, "solidified electrolyte" means an electrolyte, which at the temperatures at which it is used is sufficiently rigid that particles/flakes in the bulk therein are substantially immobilised by the high viscosity /rigidity of the electrolyte and that it doesn't flow or leak. In the preferred case, such an electrolyte has the proper Theological properties to allow for the ready application of this material on a support in an integral sheet or in a pattern, for example by conventional printing methods. After deposition, the electrolyte formulation should solidify upon evaporation of solvent or because of a chemical cross-linking reaction, brought about by additional chemical reagents or by physical effect, such as irradiation by ultraviolet, infrared or microwave radiation, cooling or any other such. The solidified electrolyte preferably comprises an aqueous or organic solvent-containing gel, such as gelatine or a polymeric gel. However, solid polymeric electrolytes are also contemplated and fall within the scope of the present invention. Furthermore, the definition also encompasses liquid electrolyte solutions soaked into, or in any other way hosted by, an appropriate matrix material, such as a paper, a fabric or a porous polymer. In some embodiments of the invention, this material is in fact the support upon which the electrochemical transistor device is arranged, so that the support forms an integral part of the operation of the device.

Materials

Preferably, the solidified electrolyte comprises a binder. It is preferred that this binder have gelling properties. The binder is preferably selected from the group consisting of gelatine, a gelatine derivative, polyacrylic acid, polymethacrylic acid, poly(vinyl-pyrrolidone), polysaccharides, polyacrylamides, polyurethanes, polypropylene oxides, polyethylene oxides, poly-(styrene sulphonic acid) and poly (vinyl alcohol) and salts and copolymers thereof; and may optionally be cross-linked. The solidified electrolyte preferably further comprises an ionic salt, preferably magnesium sulphate if the binder employed is gelatine. The solidified electrolyte preferably further contains a hygroscopic salt such as magnesium chloride to maintain the water content therein.

The organic material for use in the present invention preferably comprises a polymer which is electrically conducting in at least one oxidation state and optionally further comprises a polyanion compound. Organic materials comprising combinations of more than one polymer material, such as polymer blends, or several layers of polymer materials, wherein the different layers consist of the same polymer or different polymers, are also contemplated. Conductive polymers for use in the electrochemical transistor device of the invention are preferably selected from the group consisting of polythiophenes, polypyrroles, polyanilines, polyisothianaphthalenes, polyphenylene vinylenes and copolymers thereof such as described by J C Gustafsson et al in Solid State Ionics, 69, 145–152 (1994); Handbook of Oligo- and Polythiophenes, Ch 10.8, Ed D Fichou, Wiley-VCH, Weinhem (1999); by P Schottland et al in Macromolecules, 33, 7051–7061 (2000); Technology Map Conductive Polymers, SRI Consulting (1999); by M Onoda in Journal of the Electrochemical Society, 141, 338–341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp, 51, 217–234 (1991). In an especially preferred embodiment, the organic material is a polymer or copolymer of a 3,4-dialkoxythiophene, in which said two alkoxy groups may be the same or different or together represent an optionally substituted oxy-alkylene-oxy bridge. In the most preferred embodiment, the polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propyleneoxy thiophene), poly(3,4-propylenedioxythiophene) derivatives, poly(3,4-butylenedioxythiophene) poly(3,4-butylenediloxythiophene) derivatives, and copolymers therewith. The polyanion compound is then preferably poly (styrene sulphonate).

The support in some embodiments of the electrochemical transistor device of the present invention is preferably selected from the group consisting of polyethylene terephthalate; polyethylene naphthalene dicarboxylate; polyethylene; polypropylene; paper; coated paper, e.g. coated with resins, polyethylene, or polypropylene; paper laminates; paperboard; corrugated board; glass and polycarbonate.

Principal Device Architectures

By patterning of the organic material of the electrochemically active element and of the contacts, electrode(s) and electrolyte in different ways, two main types of electrochemical transistor devices can be realised. These main types, bi-stable and dynamic electrochemical transistor devices, will now be exemplified along with reference to figures thereof and an outline of their working principles.

Figure 1B:
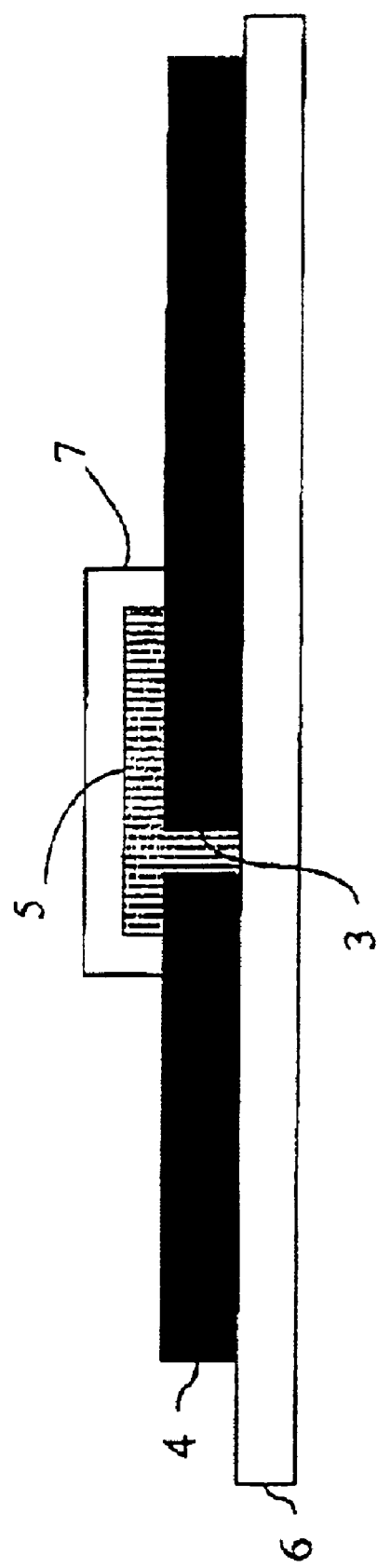

Bi-stable transistor (type 1): FIGS. 1A and 1B schematically show one embodiment of a bi-stable transistor. The transistor comprises a source contact 1, a drain contact 2 and an electrochemically active element 3, which have all been formed from a continuous piece of organic material. Both the source and drain contacts are in electrical contact with an external power source, which allows the application of a voltage $V_{ds}$ between them. The transistor further comprises a gate electrode 4, which can be formed from the same organic material as the source and drain contacts and the electrochemically active element. The gate electrode 4 is in electrical contact with an external power source, which allows applying a voltage $V_g$ between the gate electrode and the electrochemically active element. This can be realised by applying $V_g$ between the gate 4 and the source 1 or the drain 2, or directly between the gate 4 and the electrochemically active element 3. All of these organic material components have been deposited in one layer on a support 6. On top of this layer, covering part of the gate electrode 4 and the active element 3, is a layer of gel electrolyte 5. Furthermore, the gel electrolyte layer 5 is covered with an encapsulating layer 7 for prevention of solvent evaporation.

Figure 1C:
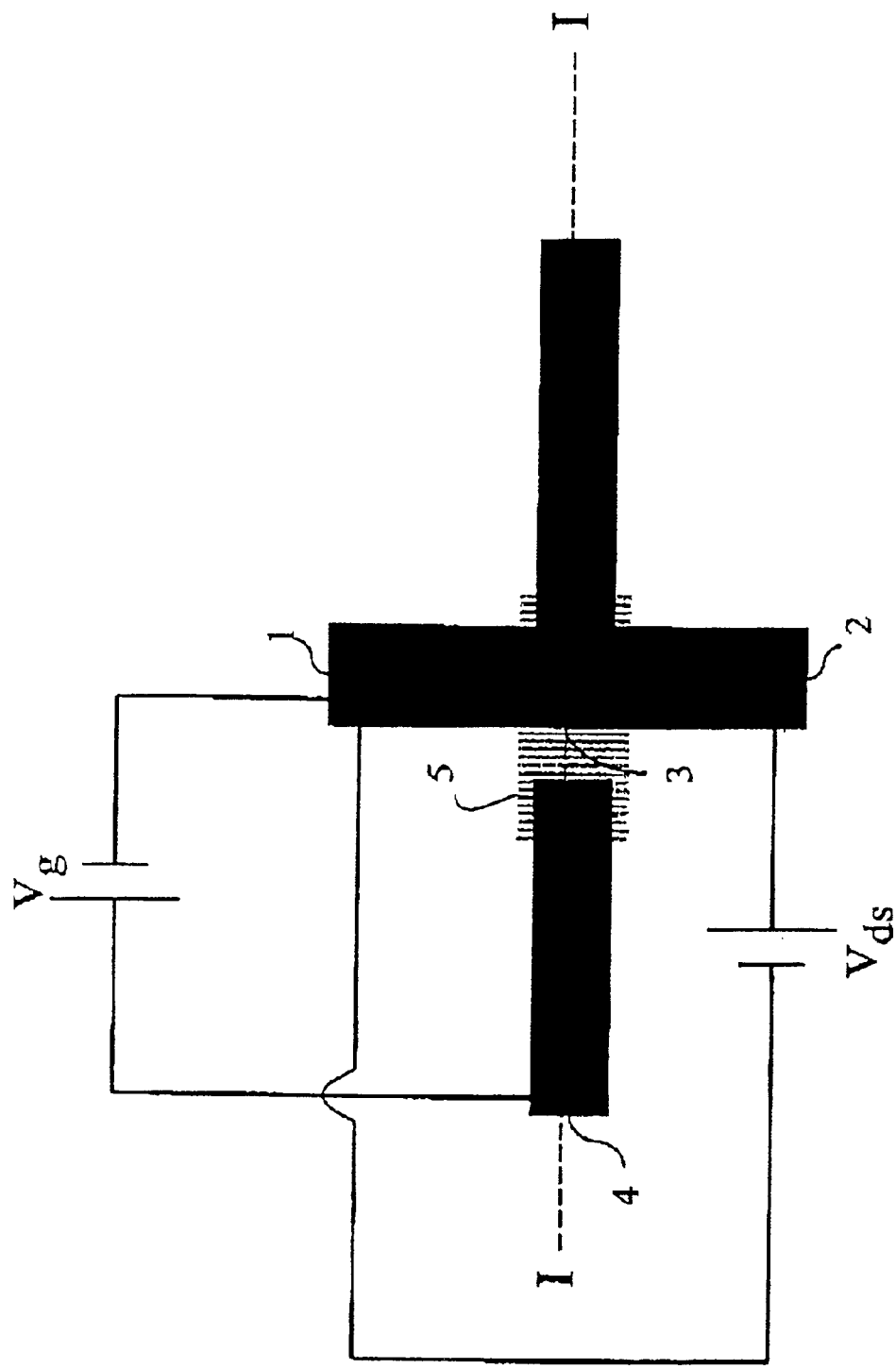

Working principle for the polarity of $V_g$ shown in FIG. 1, and in the case of an organic material which is conducting in its oxidised state and non-conducting when reduced to its neutral state: when a gate voltage $V_g$ is applied between the gate electrode 4 and the electrochemically chemically active element 3, the gate electrode is polarised positive (anode), and the electrochemically active element is polarised negative (cathode). This leads to onset of electrochemistry in the electrochemically active element and at the gate electrode; the organic material in the transistor channel is reduced at the same time as an oxidation reaction takes place at the gate electrode. The reduced material in the transistor channel displays a drastically diminished electrical conductivity, which results in the closure of the transistor channel and an effective reduction of the current between source and drain for a given source-drain voltage $V_{ds}$, i e the transistor is in an "off" mode. When the external circuit supplying voltage to the gate electrode and the electrochemically active element is broken, the oxidation state of the transistor channel is maintained. No reversal of the electrochemical reactions is possible because of the interruption by electrolyte 5 of electron flow between gate electrode 4 and electrochemically active element 3.

Thus, the bi-stable transistor has a memory-function: It is possible to switch on or off the transistor channel with short pulses of gate voltage, $V_g$, applied to the gate. The respective conductivity states remain when gate voltage is removed (a zero-power device). Further adjustments of conduction characteristics in the electrochemically active element, or resetting thereof to the initial, high conductivity modes can be performed by applying different voltages to the gate electrode.

As explained above in the summary, the transistor device of the invention may easily be made to function as a diode. This is achieved for example through a transistor device architecture as shown schematically in FIG. 1C. In comparison to the device discussed above in relation to FIG. 1A, the gate voltage is instead applied between the gate electrode 4 and the source contact 1. There is no difference in potential between the positions for the negative polarity of the $V_g$ voltage, but the change of this position makes it possible to short-circuit the gate electrode and source contact through replacing $V_g$ with a conductor. Such a short-circuit results in that, when a positive voltage is applied to the source contact 1, the gate electrode 4 will polarised positively also. Accordingly, and as described above, resistance will mount within the transistor channel upon reduction or oxidation in the electrochemically active element 3, which resistance will hinder charge transport therethrough. As the resistance in the channel mounts, the current supplied to the "common" source and gate will increasingly be led to the gate electrode, further feeding the electrochemical reaction and thus raising the resistance in the transistor channel even more. If the polarity of the source-drain voltage is reversed, the opposite situation will arise, so that the electrochemically active element is instead rendered conducting. Thus, the device, when the source and gate are connected in this way, will allow current in one direction and not in the other, and in practice functions as a diode.

Figure 2A:
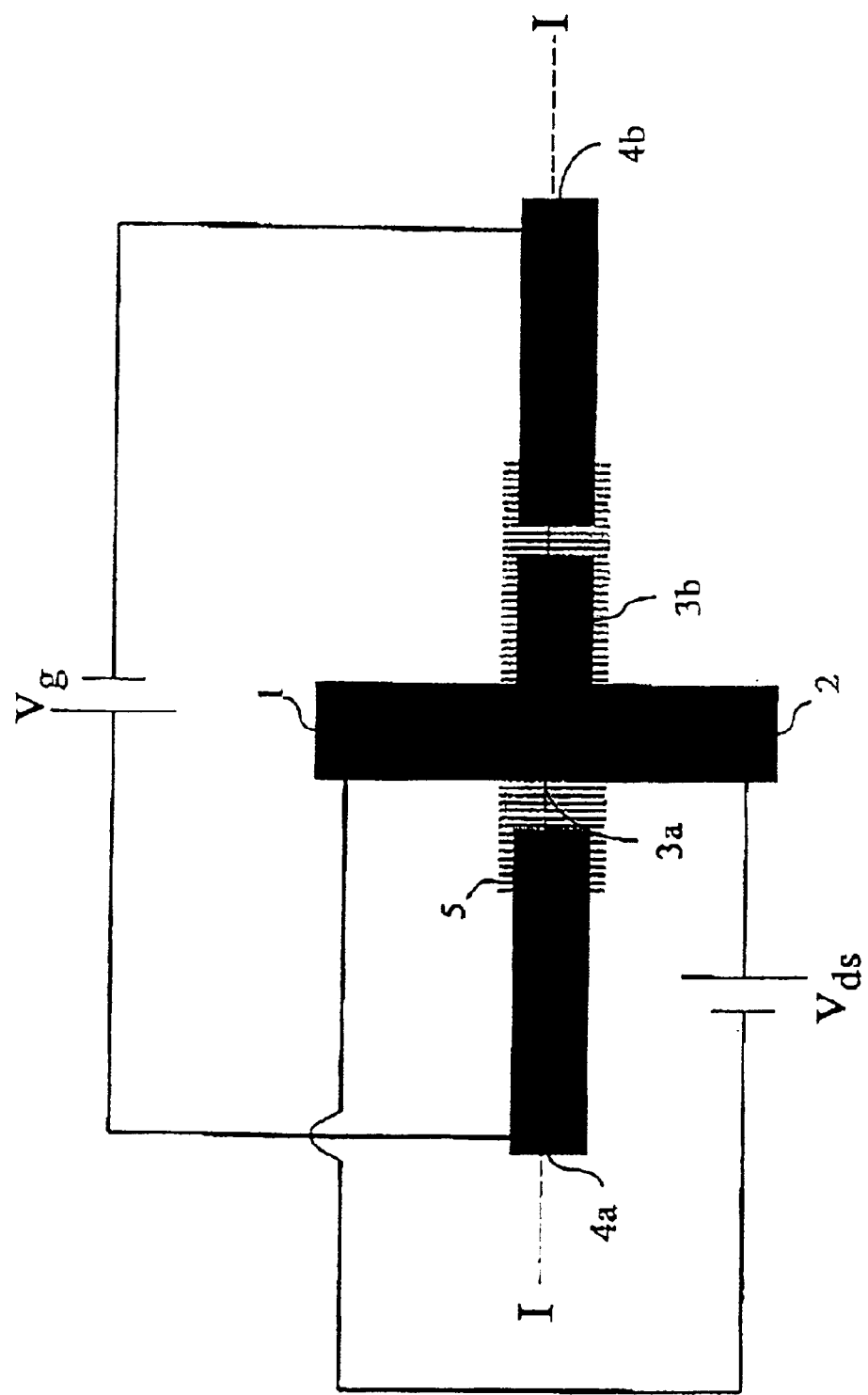
FIG. 2. Schematic structure of a dynamic transistor according to the invention, showing (A) a top view and (B) a cross-section along I—I in A.
Figure 2B:
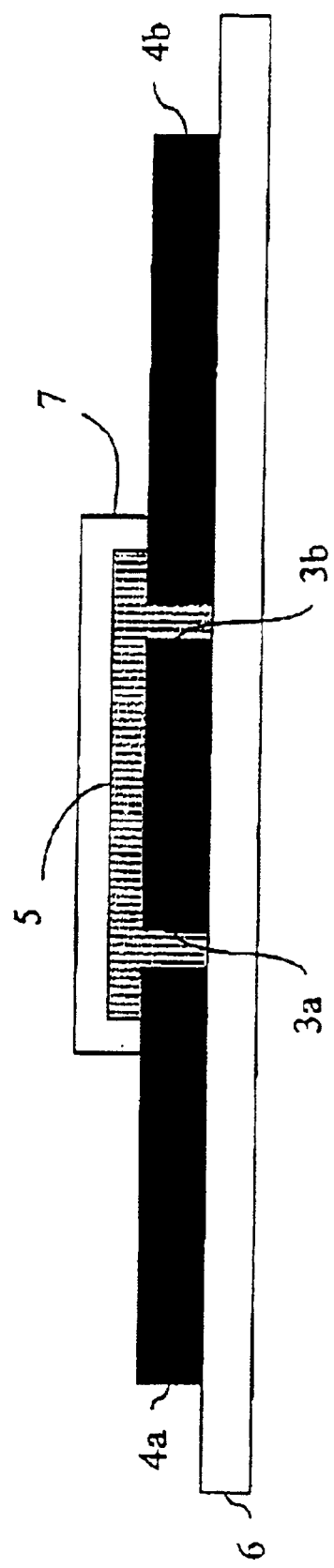

Dynamic transistor: FIGS. 2A and 2B schematically show a dynamic transistor. The transistor comprises a source contact 1, a drain contact 2 and an electrochemically active element 3, which have all been formed from a continuous piece of organic material. The electrochemically active element 3 comprises a transistor channel 3a and a redox sink volume 3b. Both the source and drain contacts are in electrical contact with an external power source, which allows the application of a voltage $V_{ds}$ between them. The transistor further comprises two gate electrodes 4a and 4b arranged on either side of the electrochemically active element 3. The gate electrodes can be formed from the same organic material as the source and drain contacts and the electrochemically active element, The gate electrodes are in electrical contact with an external power source, which allows application of a voltage $V_g$ between them. All of these organic material components have been deposited in one layer on a support 6. On top of this layer, covering parts of the gate electrodes 4a and 4b and the active element 3, is a layer of gel electrolyte 5. Furthermore, the gel electrolyte layer 5 is covered with an encapsulating layer 7 for prevention of solvent evaporation.

Working principle for the polarity of $V_g$ shown in FIG. 2, and in the case of an organic material which is conducting in its oxidised state and non-conducting when reduced to its neutral state: when a gate voltage $V_g$ is applied between the gate electrodes 4a and 4b, gate electrode 4a is polarised positive (anode), and gate electrode 4b is polarised negative (cathode). This leads to onset of electrochemistry in the electrochemically active element; the organic material in the transistor channel 3a (adjacent to gate electrode 4a) is reduced, while the organic material in the redox sink volume 3b (adjacent to gate electrode 4b) is oxidised. These electrochemical reactions require an internal transfer of electrons within the electrochemically active element. Electrons that are released in the oxidation reaction in the redox sink volume migrate to the transistor channel, where they replenish the electrons consumed in the reduction of organic material occurring in this segment of the electrochemically active element. The reduced volume in the transistor channel displays a drastically diminished electrical conductivity, which results in the closure of the transistor channel and an effective reduction of the source drain current for a given source drain voltage $V_{ds}$, i e the transistor is "off". When the external circuit applying voltage to the gate electrodes 4a and 4b is broken, a spontaneous discharge occurs, in that electrons flow from the reduced material in the transistor channel to the oxidised material in the redox sink volume, until the original redox state is re-established within the electrochemically active element. For maintenance of overall charge neutrality, this flow of electrons within the electrochemically active element is accompanied by an ion flow within the solidified electrolyte.

Figure 3A:
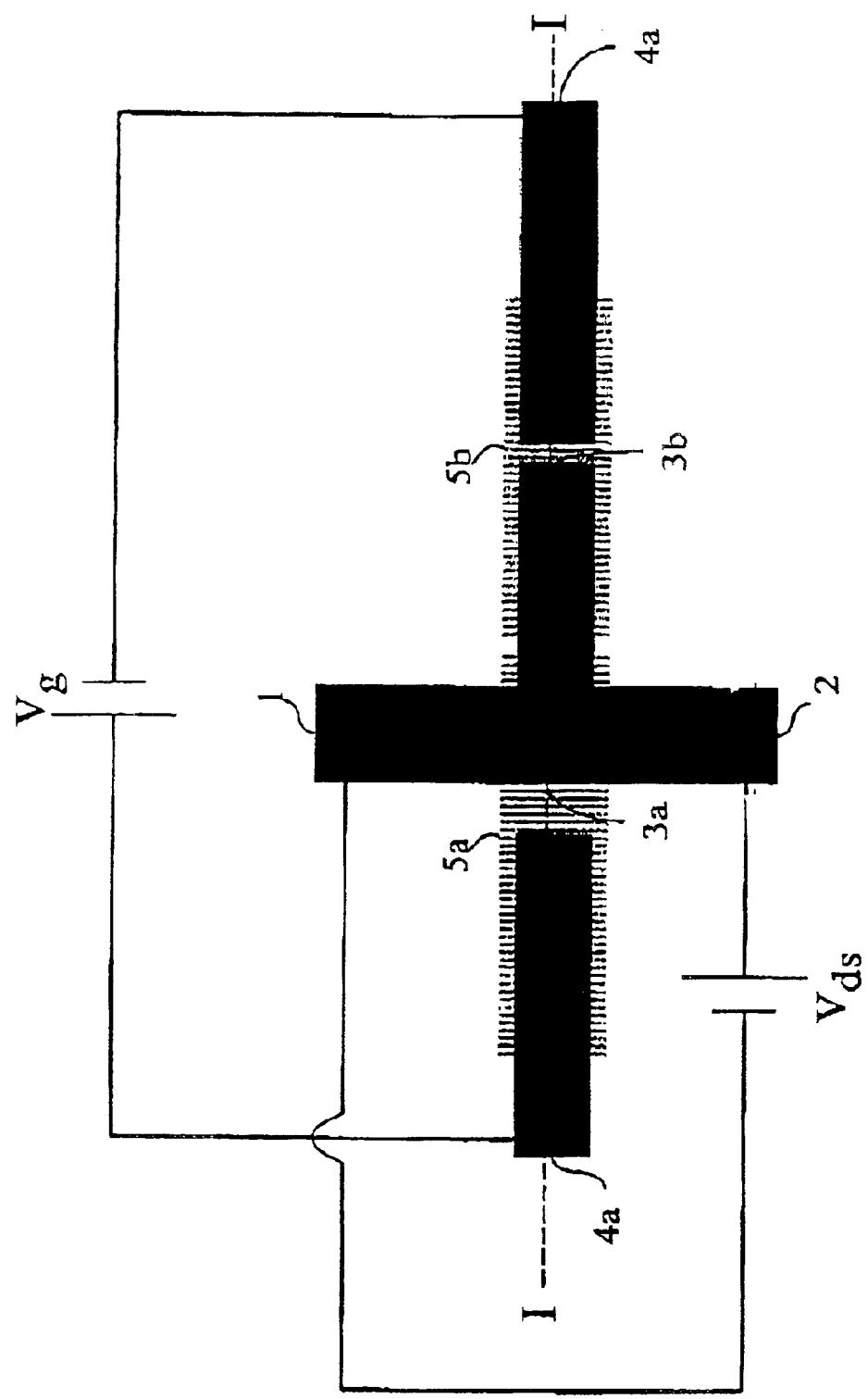
FIG. 3. Schematic structure of another embodiment of a bi-stable transistor according to the invention, showing (A) a top view and (B) a cross-section along I—I in A.
Figure 3B:
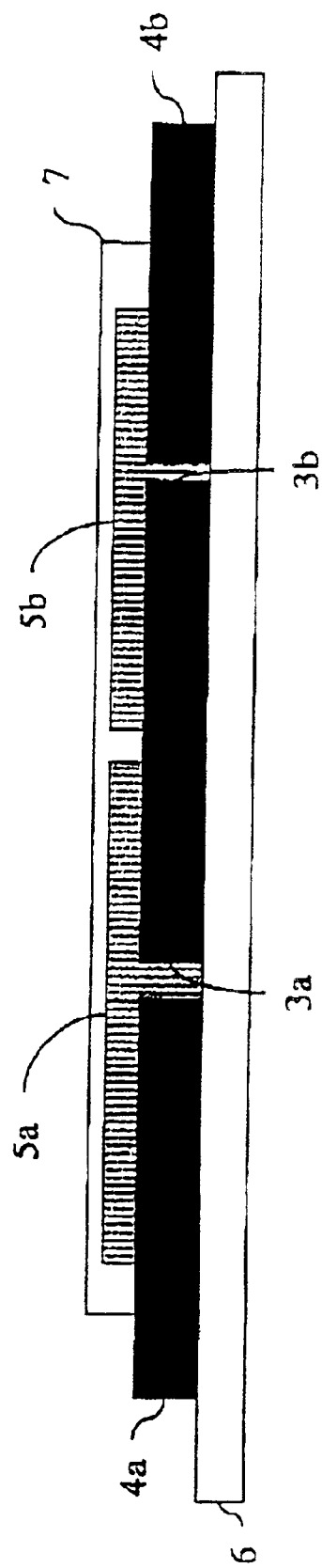

Bi-stable transistor (type 2): FIGS. 3A and 3B schematically show another embodiment of a bi-stable transistor, the architecture of which is based on the dynamic transistor architecture described immediately above. With reference to FIGS. 3A and 3B, this embodiment of a bi-stable transistor has the same components as said dynamic transistor, the difference being that the layer of solidified electrolyte 5 is patterned, forming two separate segments of electrolyte 5a and 5b. This patterning has the effect of interrupting ion flow within the electrolyte, which interruption in turn means that no spontaneous reversal of electrochemical reactions can occur between transistor channel 3a and redox sink volume 3b. In similarity to the case of the first bi-stable transistor device described above, the oxidation state of the transistor channel is maintained when the external circuit, here supplying voltage to the gate electrodes, is broken.

Experiment 1—Materials and Methods

Bi-stable (type 1) and dynamic transistors were realised by patterning films of partially oxidised poly(3,4-ethylenedioxythiophene) with poly(styrene sulphonate) as counterions (frequently referred to as PEDOT:PSS in the present text) into a T-shaped structure. The design followed the schematic drawings of the bi-stable and dynamic transistors presented in FIGS. 1 and 2, respectively. In its pristine, partially oxidised state, PEDOT:PSS films are conductive, providing the opportunity of modulating the current in the transistor channel by reduction of the PEDOT:PSS electrochemically. All processing and material handling was done in ambient atmosphere.

Patterning through screen-printing; PEDOT:PSS was applied as a thin film on a polyester carrier, Orgacon™ EL-300Ω/square, as provided by AGFA, Conducting patterns were generated using a screen-printed deactivation paste: Orgacon-Strupas gel, as provided by AGFA, was mixed with an aqueous sodium hypochlorite solution, resulting in a concentration of the active degradation agent of approximately 1.2%. Printing was performed using a manual screen printing board (Movivis, purchased from Schnaidler) using a screen with 77 lines/cm mesh. After 1 minute, the deactivation agent was removed from the PEDOT:PSS film by washing thoroughly with copious amounts of water.

Deposition of source and drain contacts and gate electrode(s): After patterning of the PEDOT:PSS film, silver paste (DU PONT 5000 Conductor) was printed on top of the PEDOT:PSS areas that form the drain and source contacts and gate electrode(s). Alternatively, the transistors can be entirely made of organic materials by locally increasing the layer thickness of the PEDOT:PSS in the gate, source and drain areas by drying-in of a PEDOT-PSS solution (Baytron P™) from Bayer) onto these areas. Such all-organic transistors were successfully realised on polyester foils.

Deposition of gelled electrolyte: Calcium chloride (2%), iso-propanol (35%), and gelatine (10%) (Extraco gelatine powder 719-30) were dissolved in de-ionised water at approximately 50° C. (weight percentages of the resulting gel in parenthesis). Structures of gelled electrolyte on patterned PEDOT:PSS film were formed by printing the gel on top of the PEDOT:PSS film. The thickness of the gelled electrolyte ranged from 20 to 100 μm. Gelled electrolyte structures were realised at line widths down to 300 μm. Screen-printing of gelled electrolyte was performed using a 32 mesh screen. The distance between the drain and source contacts was typically 1 to 2 mm.

Encapsulation: The gelled electrolyte was coated with a waterproof coating, such as plastic paint or foils, encapsulating the device. Shelf lifetimes of several months were achieved.

Electrical characterisation: All testing was performed in ambient atmosphere at room temperature. Current-voltage (I-V) transistor curves were measured with a HP Parameter Analyzer 4155 B, in combination with an external HP E3631A power supply.

Experiment 1—Results

Bi-stable transistor: A bi-stable transistor such as that shown schematically in FIGS. 1A and 1B was realised. The bi-stable transistor had a transistor channel width of 600 µm and a gel width of 800 µm, with a transistor channel of 0.48 cm$^2$. However, smaller dimensions were also successfully tested using photolithographic photoresist patterning in combination with reactive ion plasma etching. These devices exhibited channel widths ranging from 5 to 20 µm and a gel width of 20 µm.

Typically, the gate voltages $V_g$ applied to the gate electrode were in the interval between 0 V and 0.7 V. Drain-source characteristics were determined by sweeping the source-drain voltage from 0 V to 2 V. The resulting I-V curves are displayed in FIG. 4.

Characteristic switching times for the conductivity modulation were determined by applying a square shaped modulation voltage (alternating between 0 V and 1 V) and measuring the resulting current changes. Typical rise and decline times (defined as the time required for a 90% increase crease respectively decrease of the current level) were determined as 0.1 s and 0.2 s, respectively.

Figure 4:
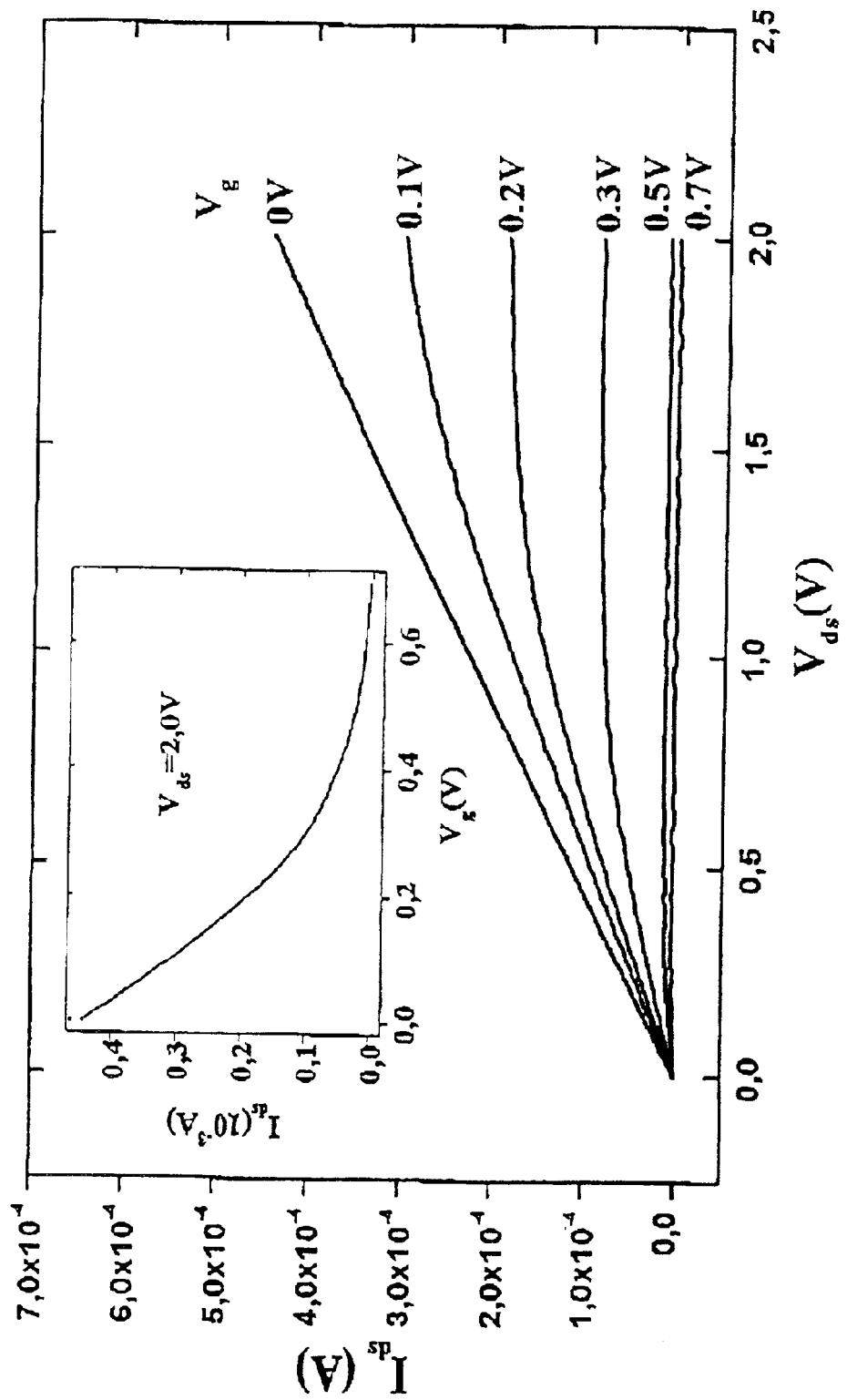
FIG. 4. $I_{ds}$ VS $V_{ds}$ characteristics at various gate voltages for experiments carried out on a bi-stable PE-DOT-PSS transistor as shown in FIG. 1. The inset shows $I_d$, vs $V_g$ at constant $V_{ds}$ ($V_{ds}$=2.0 V).

On/Off ratios (defined as the current ratio $I_{ds,max}/I_{ds,min}$ at a source-drain voltage $V_{ds}$ of 2 V for $V_g=0$ V (on) and $V_g=0.7$ V (off)) reached 15000. FIG. 4 displays the output characteristics of the bi-stable transistor, $I_{ds}$ vs $V_{ds}$ for different gate voltages.

The inset in FIG. 4 shows the source-drain current $I_{ds}$ as a function of the gate voltage $V_g$ for a constant source-drain voltage $V_{ds}$ ($V_{ds}=2$ V). From these curves, an important parameter, the trans-conductance $g_m$, can be evaluated. $g_m$ is defined as:

$$g_m = \frac{\delta I_{ds}}{\delta V_g}(V_{ds} = \text{constant})$$

The value of the trans-conductance of the bi-stable transistor device was found to be −1.2 mA/V.

Dynamic transistor: A dynamic transistor such as that shown schematically in FIGS. 2A and 2B was realised. The dynamic transistor had a channel width of 250 µm and a gel width of 900 µm, with a transistor channel of 0.23 cm$^2$. However, smaller dimensions of PEDOT and gel patterns down to 4 µm were successfully reached using photolithographic patterning. These devices exhibited channel widths ranging from 4 to 20 µm and a gel width of 20 µm.

Figure 5:
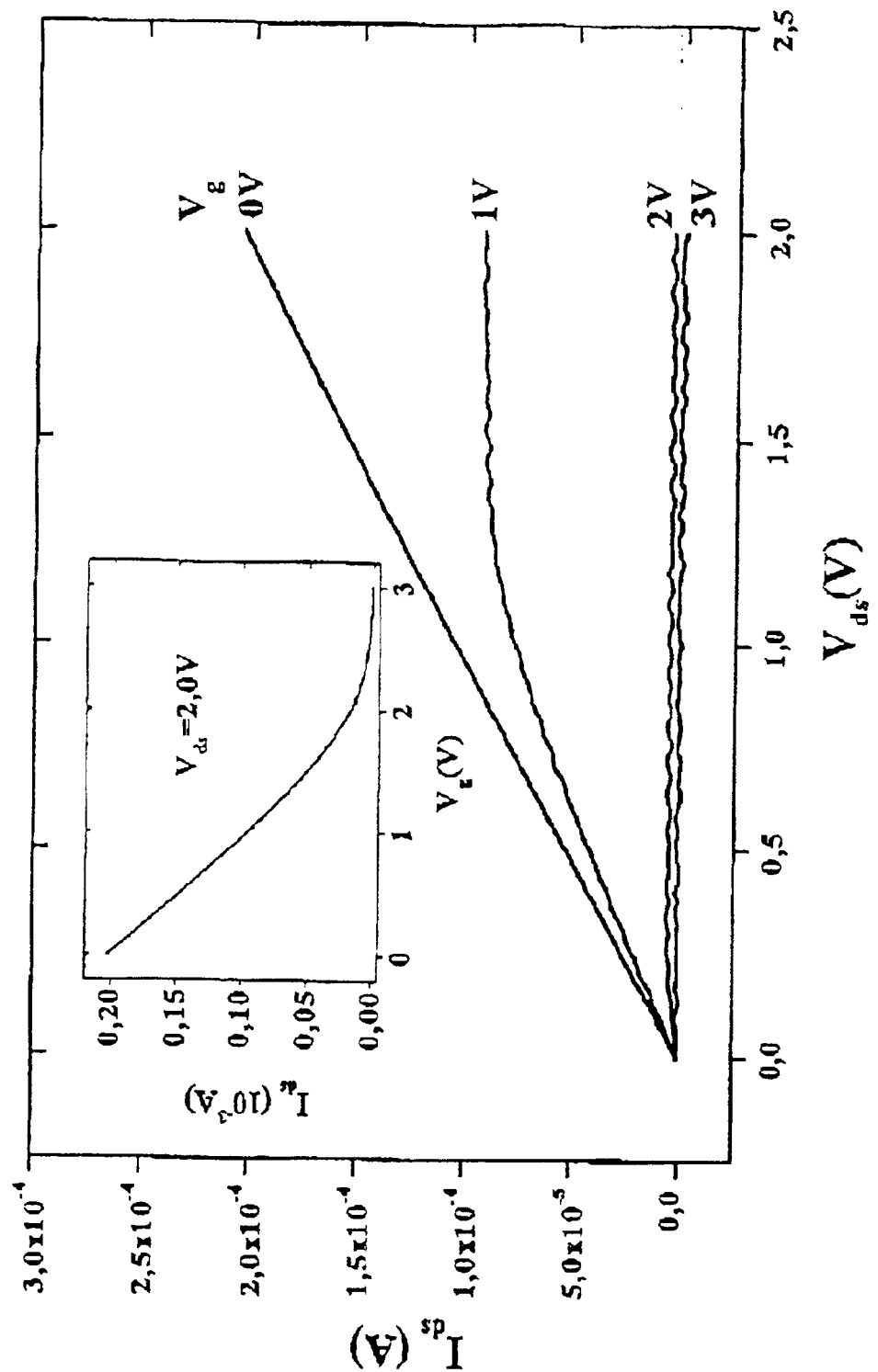
FIG. 5. $I_{ds}$ V5 $V_{ds}$ characteristics at various gate voltages for experiments carried out on a dynamic transistor. The inset shows $I_d$ vs $V_g$ at constant $V_{ds}$ ($V_{ds}$=2.0 V)

Typically, the gate voltages $V_g$ applied to the gate electrodes spanned an interval of 0 V to 3 V. On/Off ratios (defined as the current ratio $I_{ds,max}/I_{ds,min}$ at a source-drain voltage $V_{ds}$ of 2 V for $V_g=0$ V (on) and $V_g=3$ V (off)) reached 1000. FIG. 5 displays the output characteristics of the dynamic transistor, $I_{ds}$ vs $V_{ds}$ for different gate voltages.

The inset in FIG. 5 shows the source-drain current $I_{ds}$ as a function of the gate voltage $V_g$ for a constant source-drain voltage $V_{ds}$ ($V_{ds}=2$ V). From these curves, the value of the trans-conductance of the dynamic transistor device was found to be −0.10 mA/V.

Experiment 2—Materials and Methods:

Bi-stable (type 1) transistors were realised by patterning films of polyaniline. The design followed the schematic drawing of the bi-stable transistor presented in FIGS. 1A and 1B.

Patterning through evaporation and doctor blade; Panipol™ F (commercial polyaniline) was provided in solution in toluene or in m-cresol, at a concentration of 10 mg/ml in both cases. One transistor was made starting from each of the two solutions of polyaniline. The solvent was evaporated, and the polyaniline formed a thin film on a plastic carrier (conventional transparency films). Conducting patterns were made using a doctor blade.

Deposition of source and drain contacts and gate electrode: After patterning of the polyaniline film, silver paste (DU PONT 5000 Conductor) was printed on top of those polyaniline areas that formed the drain and source contacts. To ensure good contact with the power source, a silver paste (DU PONT 5000 Conductor) was printed on to the areas not covered with electrolyte on the gate electrode. Alternatively, the transistors can be entirely made of organic materials by locally increasing the thickness of the layer of polyaniline in the gate, source and drain areas, by drying-in of a polyaniline solution (e g Panipol™) onto these areas.

Deposition of gelled electrolyte: In the transistor employing polyaniline originally dissolved in toluene, gelatine (Extraco gelatine powder 719-30) was dissolved in de-ionised water at approximately 5° C., in an amount resulting in a gel having 10% by weight of gelatine, which was used as electrolyte. In the transistor employing polyaniline originally dissolved in m-cresol, Blagel™ (purchased from Apoteksbolaget, Sweden) was used as gelled electrolyte. Structures of gilled electrolyte on the respective patterned polyaniline films were formed by painting the gel on top of the polyaniline films with a brush. The thickness of the gelled electrolyte ranged from 100 to 300 µm. The distance between the drain and source contacts was typically from 1 to 2 cm.

Electrical characterisation: All testing was performed in ambient atmosphere at room temperature. Current-voltage (I-V) transistor curves were measured with a HP Parameter Analyzer 4155 B in combination with an external HP E3631A power supply.

Experiment 2—Results

Figure 6A:
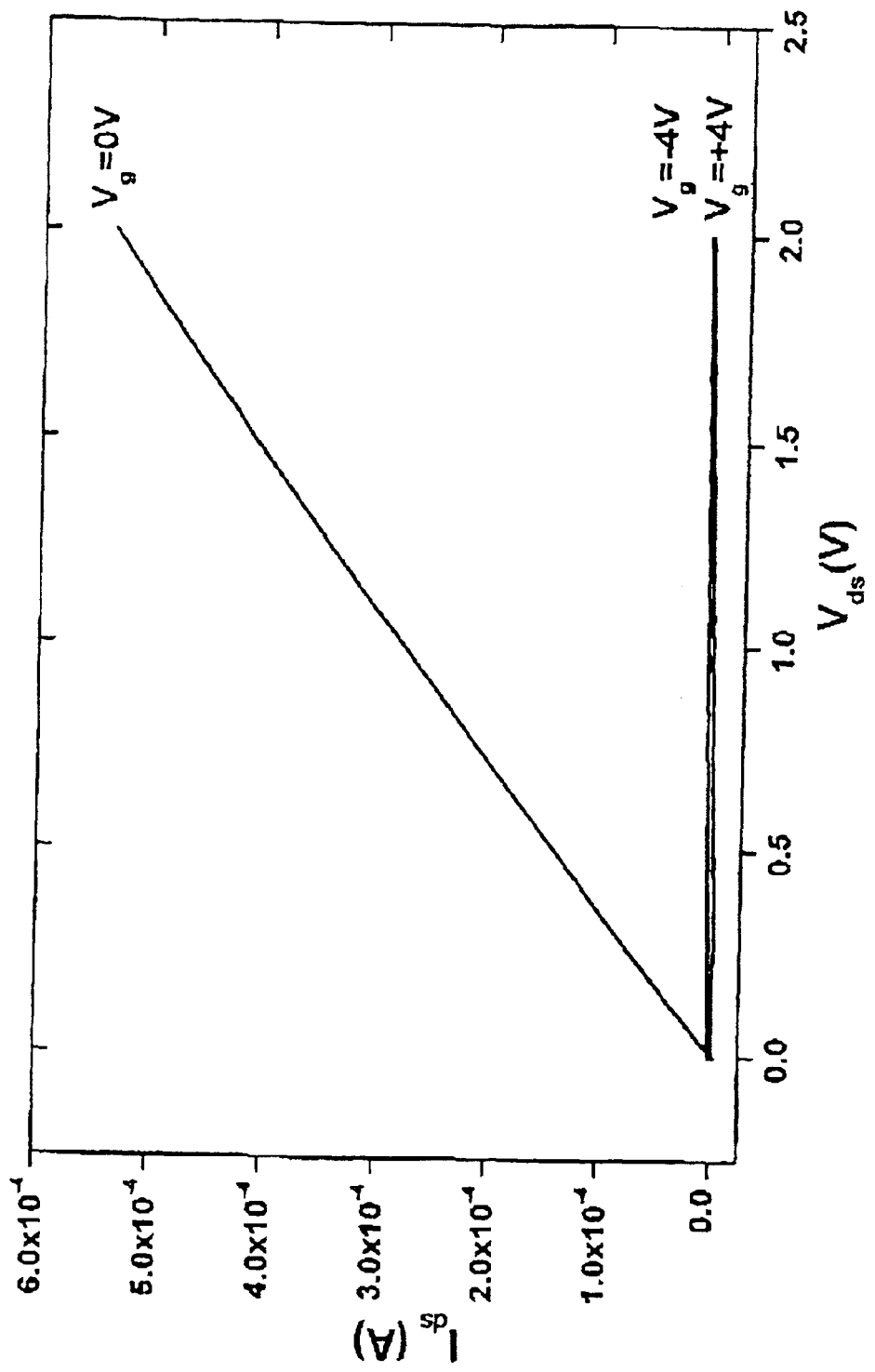
FIG. 6. $I_{ds}$ VS $V_{ds}$ characteristics at various gate voltages for experiments carried out on a bi-stable polyaniline transistor as shown in FIG. 1. The polyaniline was supplied in toluene solution. (A) General characteristics. (B) Y-axis expansion of a part of the diagram shown in A.
Figure 6B:
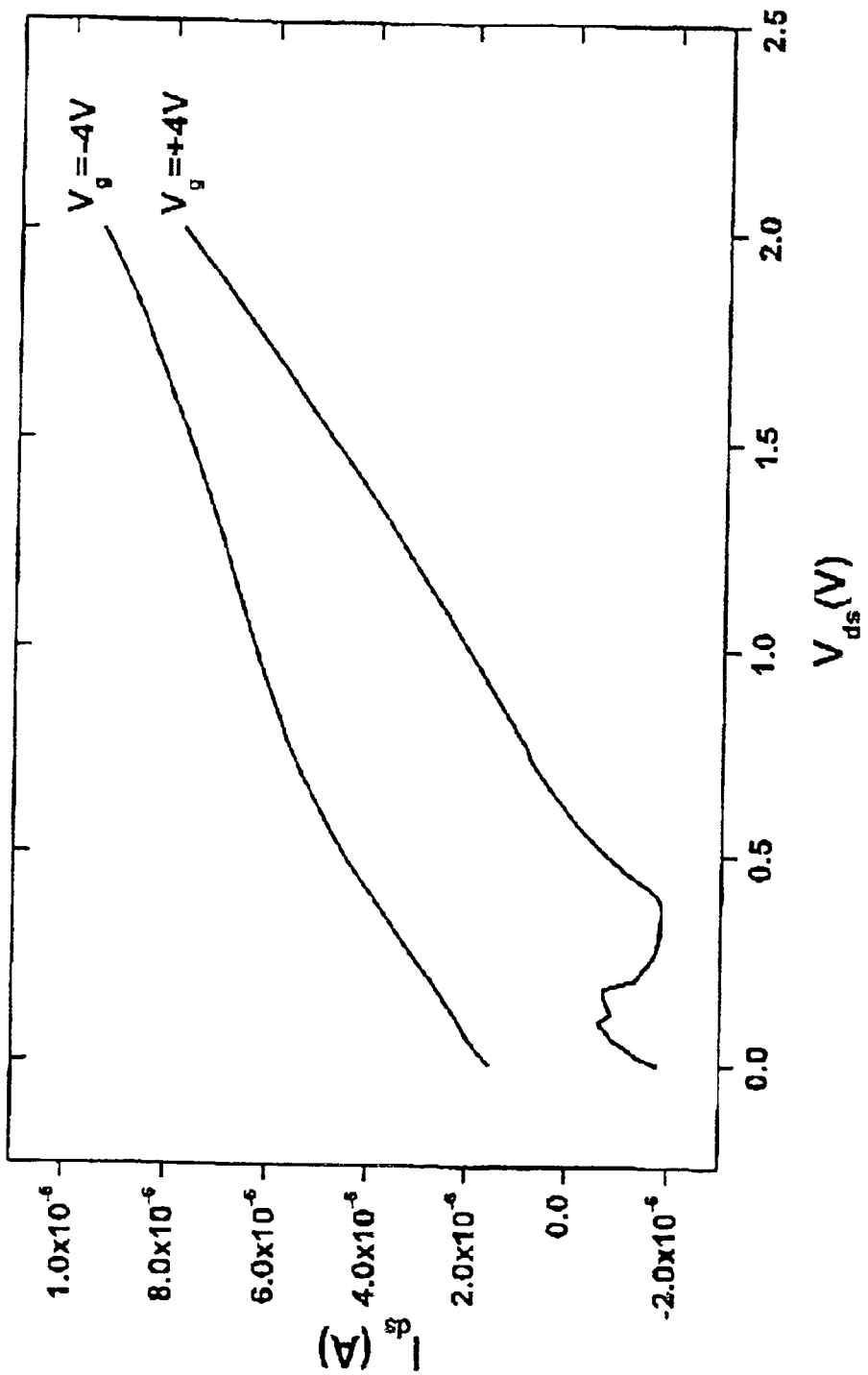
Figure 7:
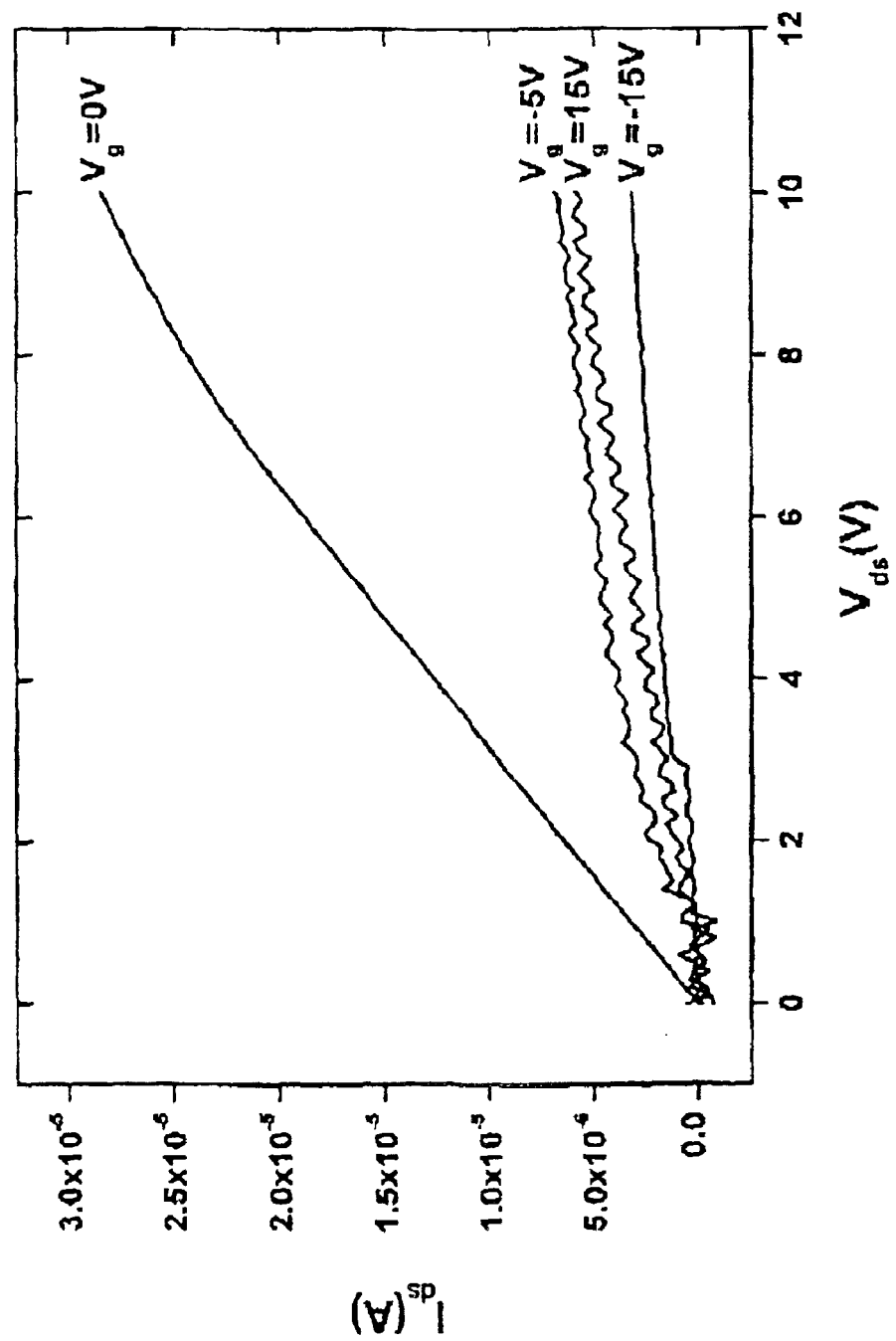
FIG. 7. $I_{ds}$ VS $V_{ds}$ characteristics at various gate voltages for experiments carried out on a bi-stable polyaniline transistor as shown in FIG. 1. The polyaniline was supplied in m-cresol solution.

Bi-stable transistors such as that shown schematically in FIGS. 1A and 1B were realised. The bi-stable transistors had a transistor channel width of 3 mm and a gel width of 4 mm, with a transistor channel of 12 mm$^2$, Typically, the gate voltages $V_g$ applied to the gate electrode were in the interval between −15 V and 15 V. Drain-source characteristics were determined by sweeping the source-drain voltage from 0 V to 10 V. The resulting I-V curves are displayed in FIG. 6 (polyaniline supplied in toluene solution) and FIG. 7 (polyaniline supplied in m-cresol solution).

On/Off ratios (defined as the current ratio $I_{ds,max}/I_{ds,min}$ at a source-drain voltage $V_{ds}$ of 2 V for $V_g=0$ V (on) and $V_g=4$ V or −4 V (off)) reached 100 for both negative and positive gate voltages.

What is claimed is:

1. A supported or self-supporting electrochemical transistor device comprising:
   a source contact,
   a drain contact,
   an electrochemically active element arranged between, and in direct electrical contact with, the source and drain contacts, which electrochemically active element comprises a transistor channel and is of a material comprising an organic material having the ability of electrochemically altering its electrical conductivity through change of redox state thereof,
   a first gate electrode and a second gate electrode, which are separated from each other and from the electrochemically active element, and a solidified electrolyte in direct electrical contact with the electrochemically active element and said two gate electrodes, such that flow of electrons between source contact and drain contact is controllable by means of a voltage applied between to said two gate electrodes.

2. The electrochemical transistor device according to claim 1, wherein the said source and drain contacts, gate electrode(s) and electrochemically active element are arranged in one common plane.

3. The electrochemical transistor device according to claim 2, wherein a continuous or interrupted layer of the solidified electrolyte covers the electrochemically active element and covers at least partially the gate electrode(s).

4. The electrochemical transistor device according to claim 1, wherein at least one of said source and drain contacts and gate electrode(s) is formed from the same material as the electrochemically active element.

5. The electrochemical transistor device according to claim 4, wherein all of the said source and drain contacts and gate electrode(s) are formed from the same material as the electrochemically active element.

6. The electrochemical transistor device according to claim 4, wherein the source and drain contacts and the electrochemically active element are formed from a continuous piece the material comprising an organic material.

7. The electrochemical transistor device according to claim 1, wherein the transistor channel retains its redox state upon removal of the gate voltage.

8. The electrochemical transistor device according to claim 1, wherein the transistor channel spontaneously returns to its initial redox state upon removal of the gate voltage.

9. The electrochemical transistor device according to claim 8, wherein the electrochemically active element further comprises a redox sink volume adjacent to the transistor channel, and wherein the electrochemical transistor device further comprises at least two gate electrodes arranged on opposite sides of the electrochemically active element so that one gate electrochemically active element so that one gate electrode is closer to the transistor channel and one gate electrode is closer to the redox sink volume.

10. The electrochemical transistor device according to claim 1, wherein the organic material is a polymer material.

11. The electrochemical transistor device according to claim 10, wherein the polymer material is selected from the group consisting of polythiophenes, polypyrroles, polyanilines, polyisothianaphtalenes, polyphenylene vinylenes and copolymers thereof.

12. The electrochemical transistor device according to claim 11, wherein the polymer material is a polymer or copolymer of a 3,4-dialkoxythiophene, wherein the two alkoxy groups may be the same or different or together represent an optionally substituted oxy-alkylene-oxy bridge.

13. The electrochemical transistor device according to claim 12, wherein the polymer or copolymer of a 3,4-dialkoxythiophene is selected from the group consisting of poly(3,4-methylenedioxythiophene), poly(3,4-ethylenedioxythiophene, poly(3,4-propylenedioxythiophene), and poly(3,4-butylenedioxythiophene).

14. The electrochemical transistor device according to claim 1, wherein the organic material further comprises a polyanion compound.

15. The electrochemical transistor device according to claim 14, wherein the polyanion compound is poly(styrene sulkphonc acid) or a salt thereof.

16. The electrochemical transistor device according to claim 1, wherein the solidified electrolyte comprises a binder.

17. The electrochemical transistor device according to claim 16, wherein the binder is a gelling agent selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol), and salts and copolymers thereof.

18. The electrochemical transistor device according to claim 1, wherein the solidified electrolyte comprises an ionic salt.

19. The electrochemical transistor device according to claim 1, wherein the electrochemical transistor device is self-supporting.

20. The electrochemical transistor device according to claim 1, wherein the electrochemical transistor device is arranged on a support.

21. The electrochemical transistor device according to claim 20, wherein the support is selected from the group consisting of polyethylene terephthalate, polyethylene naphthalene dicarboxylate, polyethylene, polypropylene, polycarbonate, paper, coated paper, resin-coated paper, paper laminates, paperboard, corrugated board and glass.

22. The electrochemical transistor device according to claim 5, wherein the source and drain contacts and the electrochemically active element are formed from a continuous piece of said material comprising an organic material.

23. The supported or self-supporting electrochemical transistor device according to claim 1, wherein the electrochemically active element further comprises a redox sink volume, and wherein the first gate electrode is associated with the transistor channel and the second gate electrode is associated with the redox sink volume.

24. The supported or self-supporting electrochemical transistor device according to claim 1, wherein the solidified electrolyte is arranged in two separate electrolyte elements, a first electrolyte element being in contact with the first gate electrode a second electrolyte element being in contact with the second gate electrode.

25. The supported or self-supporting electrochemical transistor device according to claim 1, wherein the solidified electrolyte covers, at least partially, the first gate electrode, the second gate electrode, and the electrochemically active element.

26. The supported or self-supporting electrochemical transistor device according to claim 1, wherein solidified electrolyte is interposed between the first gate electrode and the electrochemically active element and between the second gate electrode and the electrochemically active ingredient.

27. A process for the production of a supported electrochemical transistor device comprising the steps of:
    forming a source contact,
    forming a drain contact,
    forming an electrochemically active element arranged between, and in direct electrical contact with the source and drain contacts, wherein said electrochemically active element comprises a transistor channel and is of a material comprising an organic material having the ability of electrochemically altering its electrical conductivity through change of redox state thereof,
    forming a first gate electrode and a second gate electrode, which are separated from each other and from the electrochemically active element, and
    forming a solidified electrolyte in direct electrical contact with the electrochemically active element and said first and second gate electrodes, wherein said contacts, electrodes, and electrochemically active element are deposited directly onto a support.

28. The process according to claim 27, wherein the contacts, electrode(s), electrochemically active element and/or electrolyte are deposited by means of printing techniques.

29. The process according to claim 27, wherein the contacts, electrode(s), electrochemically active element and/or electrolyte are deposited by means of coating techniques.

30. The process according to claim 27, wherein the organic material comprises a polymer, wherein the polymer is deposited on the support through in situ polymerisation.

31. The process according to claim 27, comprising patterning of any one of the contacts, electrode(s) and electrochemically active element using a subtractive method.

32. The process according to claim 31, wherein the patterning is performed through chemical etching.

33. The process according to claim 31, wherein the patterning is performed through gas etching.

34. The process according to claim 31, wherein the patterning is performed by mechanical means selected from the group consisting of scratching, scoring, scraping and milling.

35. The process according to claim 28, wherein the organic material comprises a polymer, wherein said polymer is deposited on a support through in situ polymerisation.

36. The process according to claim 29, wherein the organic material comprises a polymer, wherein said polymer is deposited on a support through in situ polymerisation.

37. The process according to claim 28, comprising patterning of any one of said contacts, electrode(s) and electrochemically active element using a subtractive method.

38. The process according to claim 28, comprising patterning of any one of said contacts, electrode(s) and electrochemically active element using a subtractive method.

39. The process for the production of a supported electrochemical transistor device according to claim 27, wherein the step of forming an electrochemically active element furthermore involves forming a redox sink volume, and such that the first gate electrode is associated with and the second gate electrode is associated with the redox sink volume.

40. The process for the production of a supported electrochemical transistor device according to claim 27, wherein the step of forming solidified electrolyte involves forming two separate electrolyte elements, a first electrolyte element being in contact with the first gate electrode and a second electrolyte element being in contact with the second gate electrode.

41. The process for the production of a supported electrochemical transistor device according to claim 27, wherein the step of forming solidified electrolyte involves covering, at least partially, the first gate electrode, the second gate electrode, and the electrochemically active element with solidified electrolyte.

42. The process for the production of a supported electrochemical transistor device according to claim 27, wherein the step of forming solidified electrolyte involves arranging solidified electrolyte between the first gate electrode and the electrochemically active element and between the second gate electrode and the electrochemically active element.

* * * * *